United States Patent
Cottle et al.

(10) Patent No.: US 10,438,797 B2
(45) Date of Patent: Oct. 8, 2019

(54) METHOD OF QUASI ATOMIC LAYER ETCHING

(71) Applicant: Tokyo Electron Limited, Minato-ku, Tokyo (JP)

(72) Inventors: Hongyun Cottle, Schenectady, NY (US); Andrew W. Metz, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/697,168

(22) Filed: Sep. 6, 2017

(65) Prior Publication Data

US 2018/0068852 A1    Mar. 8, 2018

Related U.S. Application Data

(60) Provisional application No. 62/384,161, filed on Sep. 6, 2016.

(51) Int. Cl.
*H01L 21/33*    (2006.01)
*H01L 21/033*   (2006.01)
(Continued)

(52) U.S. Cl.
CPC .... *H01L 21/0338* (2013.01); *H01L 21/02118* (2013.01); *H01L 21/0335* (2013.01);
(Continued)

(58) Field of Classification Search
CPC .......... H01L 21/02118; H01L 21/0335; H01L 21/0337; H01L 21/0338; H01L 21/31116; H01L 21/31144
(Continued)

(56) References Cited

U.S. PATENT DOCUMENTS

2009/0017401 A1* 1/2009 Ito ............... H01L 21/0273
430/323
2009/0286400 A1* 11/2009 Heo ............. H01L 21/0273
438/694
(Continued)

FOREIGN PATENT DOCUMENTS

KR   10-2013-010250 A   9/2013

OTHER PUBLICATIONS

PCT International Search Report for International application No. PCT/US2017/050310 dated Dec. 15, 2017, Korean Intellectual Property Office, Korea.
(Continued)

*Primary Examiner* — Lan Vinh
(74) *Attorney, Agent, or Firm* — Wood Herron & Evans LLP

(57) ABSTRACT

Techniques herein include an etch process that etches a layer of material incrementally, similar to mono-layer etching of atomic layer etching (ALE), but not necessarily including self-limiting, mono-layer action of ALE. Such techniques can be considered as quasi-atomic layer etching (Q-ALE). Techniques herein are beneficial to precision etching applications such as during soft-mask open. Techniques herein enable precise transfer of a given mask pattern into an underlying layer. By carefully controlling the polymer deposition relative to polymer assisted etching through its temporal cycle, a very thin layer of conformal polymer can be activated and used to precisely etch and transfer the desired patterns.

17 Claims, 4 Drawing Sheets

(51) Int. Cl.
*H01L 21/02* (2006.01)
*H01L 21/311* (2006.01)

(52) U.S. Cl.
CPC .... *H01L 21/0337* (2013.01); *H01L 21/31116* (2013.01); *H01L 21/31144* (2013.01)

(58) Field of Classification Search
USPC ....... 438/696, 700, 706, 710, 712, 714, 717, 438/719, 723, 725, 736, 695, 770, 780
See application file for complete search history.

(56) References Cited

U.S. PATENT DOCUMENTS

| | | | |
|---|---|---|---|
| 2010/0173494 A1* | 7/2010 | Kobrin | H01L 21/0337 438/694 |
| 2012/0219902 A1 | 8/2012 | Bae et al. | |
| 2013/0108833 A1* | 5/2013 | Brink | H01L 21/0332 428/156 |
| 2015/0140827 A1* | 5/2015 | Kao | H01L 21/31116 438/704 |
| 2016/0109804 A1 | 4/2016 | Huli | |
| 2016/0343580 A1* | 11/2016 | Hudson | H01J 37/32513 |

OTHER PUBLICATIONS

Yannick Feurprier et al., Trench and hole patterning with EUV resists using dual frequency capacitively coupled plasma (CCP), Proceedings of SPIE, 2015, vol. 9428, pp. 94280F-1-94280F-10, doi: 10.1117/12.2086519 See pp. 94280F-5-94280F-9 and figures 6-10.

Changwoong Chu et al., Effects of fluorocarbon polymer deposition on the selective etching of SiO 2 /photoresist SiO2/photoresist in high density plasma, JVSTB, Dec. 2000, vol. 18, No. 6, pp. 2763-2768, ISSN: 0734-211X See p. 2768.

\* cited by examiner

| Post Mask Open | Optimized CW Process | Quasi-ALE Process | Optimized Quasi-ALE Process |
|---|---|---|---|
| 1X2 CH | | | |
| CD vs. S/R | 21.1 / 43.3<br>S/R = 0.76 | 22.9 / 48.1<br>S/R = 0.36 | 22.8 / 48.7<br>S/R = 0.22 |
| XLS | | | |
| CD/LWR/LER (nm) | 20.2 / 3.6 / 2.3 | 22 / 3.2 / 2.5 | 23.1 / 3.1 / 2.0 |
| Xsem | | | |
| Photoresist Remaining (nm) | 9 nm Tapered Profile | 21 nm Straight Profile | 18 nm Straight Profile |

FIG. 7

| Post Mask Open | Quasi-ALE Process | Optimized Quasi-ALE Process #1 | Optimized Quasi-ALE Process #2 |
|---|---|---|---|
| 1X2 CH | | | |
| CD vs. S/R | 22.9 / 48.1<br>S/R = 0.36 | 22.8 / 48.7<br>S/R = 0.22 | 22.3 / 45.8<br>S/R = 0.42 |
| XLS | | | |
| CD/LWR/LER (nm) | 22 / 3.2 / 2.5 | 23.1 / 3.1 / 2.0 | 21.2 / 2.8 / 2.1 nm |
| Xsem | | | |
| Photoresist Remaining (nm) | 21 nm Straight Profile | 18 nm Straight Profile | 21 nm Slight Taper |

FIG. 8

METHOD OF QUASI ATOMIC LAYER ETCHING

CROSS REFERENCE TO RELATED APPLICATIONS

The present application claims the benefit of U.S. Provisional Patent Application No. 62/384,161, filed on Sep. 6, 2016, entitled "Method of Quasi Atomic Layer Etching," which is incorporated herein by reference in its entirety.

BACKGROUND OF THE INVENTION

This disclosure relates to semiconductor fabrication including etching of substrates such as wafers.

Fabrication of integrated circuits (IC) in the semiconductor industry typically employs plasma processing to create and assist surface chemistry necessary to remove material from, and deposit material to, a substrate within a plasma processing chamber. Examples of plasma processing apparatus include a plasma CVD (Chemical Vapor Deposition) apparatus configured to deposit a thin film on a substrate, and a plasma etching apparatus configured to remove material from a substrate, which can include using an etch mask to define locations for removing material. In general, such plasma processing systems form plasma under vacuum conditions by flowing a process gas into a processing chamber and heating electrons to energies sufficient to sustain ionizing collisions. Moreover, the heated electrons can have energy sufficient to sustain dissociative collisions and, therefore, a specific set of gases under predetermined conditions (e.g., chamber pressure, gas flow rate, etc.) are chosen to produce a population of charged species and/or chemically reactive species suitable to a particular process being performed within the chamber (e.g., etching processes where materials are removed from the substrate or deposition processes where materials are added to the substrate).

SUMMARY

Continued pitch scaling requires advanced circuitry designs to meet diverse applications and product requirements. Complex circuit designs need to be transferred precisely into a final product for circuits and devices to function properly. Conventional dry plasma etching, when used for pattern transfer, has challenges in maintaining CDs of various features in relief patterns. Maintaining CDs during etch is difficult because such etch processes tend to suffer from pattern density dependent etching in which transport of reactive and charged species varies, as well as micro-loading and aspect ratio dependences. As pattern density and pitch scaling increases, there is a strong need for etch processes to eliminate iso-dense loading and pattern density effects.

Techniques herein include a novel etch process employing a quasi-atomic layer etching (Q-ALE) during softmask open. Mask materials can include, but are not limited to, carbon, SiOC, SiON and other mask materials. Techniques herein enable precise transfer of a given mask pattern into an underlying layer. Embodiments herein include maintaining critical feature dimensions for complicated mask designs, such as elliptical contact minor vs major axis critical dimension (CD) ratio, short bar end length, and T-bar bend curvatures.

The Q-ALE process herein carefully controls polymer deposition with respect to polymer-assisted etching through a temporal cycle. For example, a relatively thin layer of conformal polymer (nm thickness range) can be used to precisely etch and transfer the desired relief pattern to an underlying layer. Through precise control of the process temporal cycle, plasma chemistry and process temperature, critical features can be transferred into a substrate with a wide range of CD tuning capabilities based on product requirements.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 7 is a table of magnified images of substrate segments processed according to embodiments disclosed herein.

FIG. 8 is a table of magnified images of substrate segments processed according to embodiments disclosed herein.

DETAILED DESCRIPTION

Figure 1:
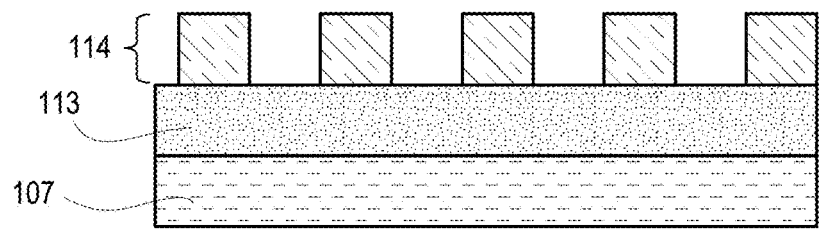
FIG. 1 is a cross-sectional schematic view of an example substrate segment showing a process flow according to embodiments disclosed herein.

Techniques herein include an etch process that etches a layer of material incrementally, similar to mono-layer etching of atomic layer etching (ALE), but not necessarily including self-limiting, mono-layer action of ALE. Such techniques can be considered as quasi-atomic layer etching (Q-ALE). Techniques herein are beneficial to precision etching applications such as during soft-mask open. Techniques herein enable precise transfer of a given mask pattern into an underlying layer. By carefully controlling the polymer deposition relative to polymer assisted etching through its temporal cycle, a very thin layer of conformal polymer can be activated and used to precisely etch and transfer the desired patterns.

The quasi-atomic layer etching (Q-ALE) process herein carefully controls polymer deposition with respect to polymer-assisted etching through a temporal cycle. For example, a relatively thin layer of conformal polymer (thin meaning in the nanometer thickness range such as single digit nanometers) can be used to precisely etch and transfer the desired relief pattern to an underlying layer. Through precise control of the process temporal cycle, plasma chemistry and process temperature, critical features can be transferred into a substrate with a wide range of CD tuning capabilities based on product requirements.

Techniques herein include a novel etch process employing a quasi-atomic layer etching (Q-ALE) during soft-mask open. Such soft-mask materials can include, but are not limited to, carbon, SiOC, SiON and other mask materials. Techniques herein enable precise transfer of a given mask pattern into an underlying layer. Embodiments herein include maintaining critical feature dimensions for complicated mask designs, such as elliptical contact minor vs major axis critical dimension (CD) ratio, short bar end length, and T-bar bend curvatures.

$C_xH_yF_z$ chemistries are employed along with Argon and oxygen-containing chemistries in the Q-ALE process herein to produce a uniform, thin layer of polymer. This thin layer of polymer is used to etch the soft-mask material. The conformal polymer deposition is beneficial to maintain pattern fidelity of a given relief pattern being used as an etch mask. Through the precision depo-etch cycle herein, only the deposited polymer is being consumed during etch. Incoming photoresist is untouched after the process reaches its depo-etch equilibrium. Consequently, etch selectivity of the photoresist is greatly improved as compared to conventional continuous wave plasma etch. For EUV resist, a given selectivity is improved by two to three times, which is important to EUV lithography implementation in high volume manufacturing because EUV resists are generally very thin and can be etched away easily. Photoresist selectivity improvement herein also provides a benefit that can be extended to other conventional chemically amplified resists, such as 193 nm resist.

Through precise control of the process temporal cycle, plasma chemistry, and process temperature, critical features can be transferred into an underlying layer with a tunable etch to photo CD bias. The process can provide a wide range of CD bias where positive CD growth, zero CD bias, or a CD reduction (shrink) of close to 50% of the incoming CD can be achieved while still maintaining a given CD aspect ratio.

By using a direct current superposition (DCS) technology, chemically amplified resist (CAR) photoresist (EUV or 193 nm) can be treated to further improve its etch resistance, contact edge roughness (CER), line edge roughness (LER), and line width roughness (LWR). With DCS, a negative direct current is applied to an upper electrode to cause a flux of ballistic electrons directed toward a substrate held below. DCS can also cause a sputtering of silicon onto the given substrate.

Techniques herein can include methods for processing substrates. Referring now to FIG. 1, a substrate 105 can be received in a processing system, such as a plasma processing system. Conventional plasma processing systems are known. The substrate 105 has a working surface. The working surface has a relief pattern 114 formed on an underlying layer 113 such that portions of the underlying layer are uncovered. The relief pattern of photoresist can be optionally cured or hardened using various curing techniques including direct current superposition to expose the substrate to ballistic electrons. In other words, an etch mask is formed on a given layer (which may itself become an etch mask). The underlying layer can be comprised of a soft-mask material. With some photolithography processes, such as EUV, the EUV photoresist is too thin or not sufficiently resistive for subsequent, conventional patterning etches, and so the initial EUV relief pattern can be transferred into a soft mask layer prior to etching further into target layers. Note that techniques herein are not limited to EUV but are also applicable to microfabrication techniques that are actually used for high volume manufacturing including front-end-of-line micro fabrication. The substrate 105 can include one or more base layers 107, as well as other layers such as planarization layers, etch stop layers, anti-reflective coatings, et cetera. The relief pattern 114 can be comprised of a photoresist material including EUV photoresist materials.

Figure 2:
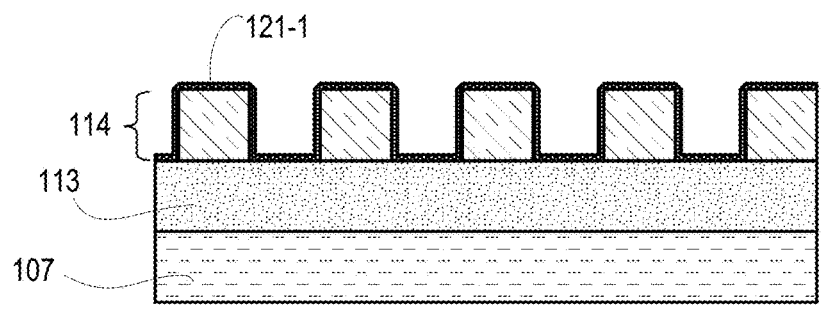
FIG. 2 is a cross-sectional schematic view of an example substrate segment showing a process flow according to embodiments disclosed herein.

Referring now to FIG. 2, a conformal film deposition process is executed that conformally deposits a polymer film 121-1 on the substrate 105. With a conformal deposition, material is more or less deposited with a same thickness on all surfaces (horizontal and vertical). In this deposition, polymer is deposited at a single-digit nanometer thickness, including a thickness of less than three nanometers.

Figure 3:
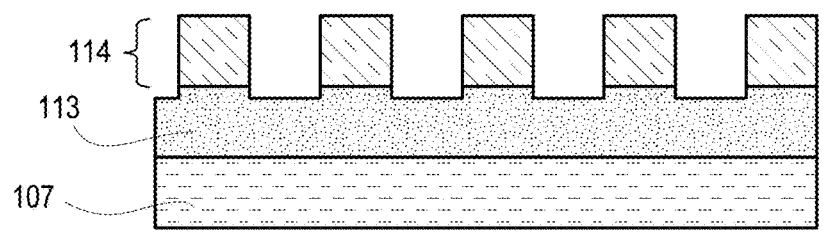
FIG. 3 is a cross-sectional schematic view of an example substrate segment showing a process flow according to embodiments disclosed herein.

Next, an activation etch process is executed that etches the underlying layer 113 using the conformal film 121-1 until the conformal film is removed from horizontal surfaces of the underlying layer 113 that are parallel to the working surface of the substrate. Such an etch technique activates the conformally deposited polymer to react with material of the underlying layer to remove a portion of the underlying layer 113. The portion removed can be greater that a mono layer of molecules but can etch many layers of molecules to several nanometers. The polymer film can also be removed from the relief pattern 114, but without removing material from the relief pattern or without removing substantial material. An example result is illustrated in FIG. 3. Note that relief pattern 114 remains intact with the initial conformal film 121-1 having been removed. Also note that underlying layer 113 has had a portion of material removed where uncovered by the relief pattern 114.

Figure 4:
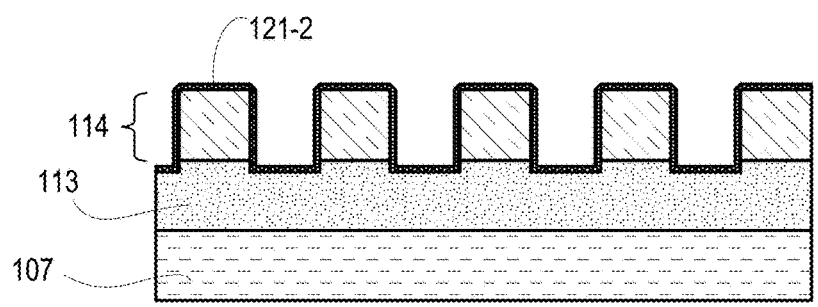
FIG. 4 is a cross-sectional schematic view of an example substrate segment showing a process flow according to embodiments disclosed herein.
Figure 5:
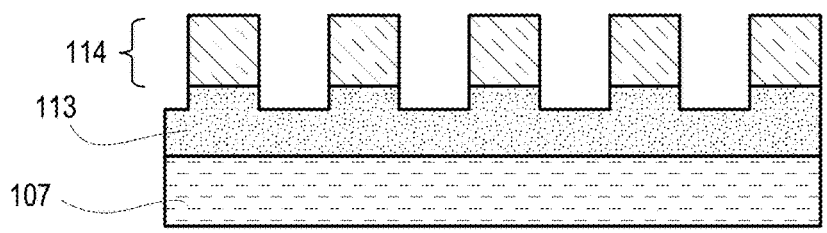
FIG. 5 is a cross-sectional schematic view of an example substrate segment showing a process flow according to embodiments disclosed herein.
Figure 6:
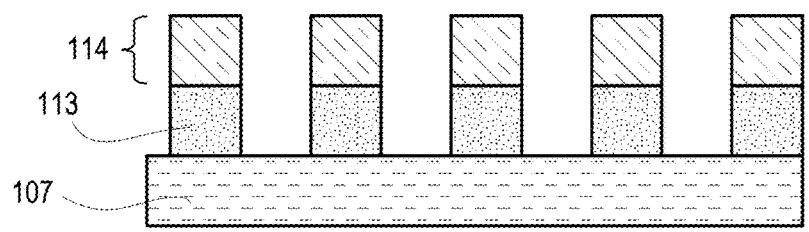
FIG. 6 is a cross-sectional schematic view of an example substrate segment showing a process flow according to embodiments disclosed herein.

The steps of conformally depositing a thin polymer film, and etching the underlying layer by activating the polymer film are cycled/repeated until removing a predetermined amount of the underlying layer (in areas/regions uncovered by the relief pattern). For example, FIG. 4 illustrates conformal film 121-2 (as a second or subsequent conformal film) having been deposited on the substrate. The conformal film 121-2 covers the relief pattern 114 as previously deposited, but also covers the underlying layer 113, extending deeper into the openings. The activating etch is executed again, which in turn removes more material from underlying layer 113. FIG. 5 illustrate an example result. Such cycling can continue until reaching a predetermined depth such as uncovering lower layers. FIG. 6 illustrates how the relief pattern 114 has been fully transferred into underlying lying layer 113. The relief pattern can then be removed and subsequent processing continued, such as using the soft mask etch mask for conventional etching.

Executing the conformal film deposition can includes maintaining plasma at a first ion energy, while the activation etch process includes maintaining plasma at a second ion energy, wherein the second ion energy is greater than the first ion energy. In alternative embodiments, plasma used during the activation etch can have a greater plasma density as compared to the deposition step. Processing can be executed in a same plasma processing chamber and so chamber parameters can be modified when switching between processes. Executing the conformal film deposition can include using a CxFy process gas. Executing the activation etch process includes stopping flow of the CxFy process gas. Executing the conformal film deposition process can include using an isotropic deposition process. Thus, ions and neutrals can flow toward the substrate without directionality. Executing the activation etch process, however, can include using an anisotropic etch process to accelerate ions toward the substrate at an angle normal to the working surface of the substrate. Executing the conformal film deposition can include controlling a degree of conformality by selectively using continuous wave plasma or pulsed plasma based on iso-dense characteristics of a working surface of the substrate. For example, to compensate for deposition or etching lag, pulsing or continuous wave plasma can be used. A given substrate can have features formed thereon with different spatial densities. In other words, some areas can be isolated from surround structures (open areas), while other areas have a density of structures such as an array of lines or fins. Accordingly, plasma deposition as well as polymer etching can selectively use different plasma properties to result in accurate etching of both isolated and dense areas on a substrate.

During the conformal deposition process, ion energy is maintained below a threshold activation energy that causes activated etching of the polymer film. Ion energy is then at or above this threshold activation energy during the activation etch process. If ion energy is too high during the deposition step, then some etching can occur. The threshold energy sufficient for activating etching depends on a particular polymer selected as well as a particular ion being used. By way of a non-limiting example, ion energy of approximately 15 eV can cause activating etching of silicon oxide in the presence of a fluorine plasma. Also, as disclosed herein, activated etching can be further controlled by selection of ion mass. For example, argon, helium, and xenon have different masses. Accordingly, a sputter rate of an activated etch can be controlled based on a particular ion used to control ion flux. Executing the activation etch process can include coupling low-frequency bias power to a plasma processing chamber used to process the substrate. Executing the conformal film deposition includes depositing the polymer film for 1-9 seconds, while executing the activation etch process includes anisotropically etching the underlying layer for 3-9 seconds.

Thus, with microfabrication techniques herein, a first plasma-based deposition step is executed which deposits a thin, conformal polymer film. Following this deposition step is an etch step or activation step. The activation step removes underlying material (such as a soft-mask) without removing the relief pattern. During this activation step, the thin polymer film can be removed/consumed, but the thin conformal polymer protects the photoresist relief pattern. These steps of depositing a thin conformal film and executing an activation etch are repeated until the underlying layer is etched through or until a predetermined depth of the underlying layer has been removed. Although most embodiments are not self-limiting (as with atomic layer etching), techniques herein can be controlled to deposit relatively thin films and use these thin films to remove underlying material such as with an anisotropic etch. One benefit of techniques herein is that both the deposition and the etch process can be completed in situ.

The conformal film deposition process can include flowing a process gas mix that includes a fluorocarbon (such as $C_4F_8$ or $C_4F_6$, and so forth) as well as a carrier gas such as Argon. Oxygen can also be included in the first process gas mixture. Plasma can be maintained using high frequency power without low frequency (bias) power. Flow of plasma products is isotropic. This conformal film deposition process can be continued for 1-9 seconds, including 3-6 seconds. This conformal film deposition process is continued until a thin polymer film is deposited on the substrate. The film is 3 nanometers or less.

After conformal thin film deposition is complete, an activation etch process is executed that etches the underlying layer using the conformal film until the conformal film is removed from horizontal surfaces of the underlying layer. For this activation etch process, a greater ion energy is used. Flow of a particular fluorocarbon from the deposition step is ceased, and the second process gas mixture can include just a carrier gas, such as argon. Optionally, oxygen can be included. The activation etch step applies low frequency power to a substrate holder to energize the second process gas mixture and draw ions toward the substrate. The energy in the ions is transferred to the deposited polymer which in turn removes part of the underlying layer. This etch step can be continued for 3-9 seconds or until the conformal film on the underlying layer is removed, which removes some of the underlying layer.

These two process steps—deposition of thin conformal film and etch activation—are repeated/cycled until a desired amount of underlying layer is removed. Plasma can remain in the processing chamber during the process step cycling. Note that conformal film will also be removed from horizontal surfaces of the relief pattern, and the relief pattern can be partially etched. Sidewall depositions of the conformal film can also be removed. Optionally, the etch activation step can be continued until all polymer depositions are removed (horizontal and vertical surfaces), or until only horizontal surface depositions are removed, thereby leaving sidewall depositions. Such a technique can be beneficial for shrink applications in which a given opening needs to shrink uniformly. This can be difficult with slot openings that have a long axis and short axis because with prolonged deposition, the y-axis can shrink more than the x-axis. With techniques herein, however, the successive small depositions of only a few nanometers (which can be etched back slightly) are added to each other yielding a uniform shrink ratio technique. Adding more oxygen to the second process gas mixture can assist with complete polymer removal, while reducing or eliminating oxygen from the second process gas mixture enables leaving sidewall depositions.

Techniques herein have many beneficial applications. One application is pattern transfer of EUV resists. EUV resists are typically not as robust as conventional photoresists. To increase sensitivity of EUV resist, metals are being added, but such metal additives bring a contamination risk to etch equipment. Techniques herein can enable pattern transfer of metal-free EUV resists as techniques herein can carefully transfer patterns in a layer-by-layer removal process without destroying EUV resists. Another benefit is shrink control of pattern transfer for transferring contact openings using conventional photoresists. Oval and slot openings can be transferred keeping their ratios, and openings can be shrunk while still maintaining dimensional ratios of openings.

FIGS. 7 and 8 are magnified images of substrate segments showing example results of techniques herein realized and the benefits thereof.

Accordingly, techniques herein present an unique etch process employing a Q-ALE technique during soft-mask open where dry plasma deposited conformal polymer is used to etch the mask layer. By consuming only the uniformly deposited thin polymer layer after reaching depo-etch equilibrium, this process is able to maintain complex pattern fidelity while provide a wide range of etch CD bias In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of processing a substrate, the method comprising:
receiving a substrate having a working surface, the working surface having a relief pattern formed on an underlying layer such that portions of the underlying layer are uncovered;
executing a conformal film deposition process that conformally deposits a polymer film on the substrate, wherein the polymer film has a thickness of less than three nanometers;
executing an activation etch process that etches the underlying layer using the polymer film until the polymer film is removed from horizontal surfaces of the underlying layer that are parallel to the working surface; and
cycling steps of conformal film deposition and activation etch until removing a predetermined amount of the underlying layer that is uncovered by the relief pattern, wherein executing the conformal film deposition includes maintaining plasma at a first ion energy, and wherein executing the activation etch process includes maintaining plasma at a second ion energy, the second ion energy is greater than the first ion energy, and the first ion energy is below a threshold energy sufficient for activating etching of a particular deposition material and ion combination.

2. The method of claim 1, wherein the relief pattern is comprised of photoresist material.

3. The method of claim 2, wherein the photoresist material is EUV photoresist.

4. The method of claim 1, wherein the underlying layer is a soft-mask material.

5. The method of claim 1, wherein executing the conformal film deposition process includes using an isotropic deposition process, and wherein executing the activation etch process includes using an anisotropic etch process.

6. The method of claim 1, wherein executing the activation etch process includes coupling low-frequency bias power to a plasma processing chamber.

7. The method of claim 1, wherein executing the conformal film deposition includes depositing the polymer film for 1-9 seconds, and wherein executing the activation etch process includes anisotropically etching the underlying layer for 3-9 seconds.

8. The method of claim 1, wherein executing the conformal film deposition includes controlling a degree of conformality by selectively using continuous wave plasma or pulsed plasma based on iso-dense characteristics of a working surface of the substrate.

9. A method of processing a substrate, the method comprising:
receiving a substrate having a working surface, the working surface having a relief pattern formed on an underlying layer such that portions of the underlying layer are uncovered;
executing a conformal film deposition process that conformally deposits a polymer film on the substrate, wherein the polymer film has a thickness of less than three nanometers;
executing an activation etch process that etches the underlying layer using the polymer film until the polymer film is removed from horizontal surfaces of the underlying layer that are parallel to the working surface; and
cycling steps of conformal film deposition and activation etch until removing a predetermined amount of the underlying layer that is uncovered by the relief pattern wherein executing the conformal film deposition includes using a $C_xF_y$ process gas, and wherein executing the activation etch process includes stopping flow of the $C_xF_y$ process gas.

10. A method of processing a substrate, the method comprising:

receiving a substrate having a working surface, the working surface having a relief pattern formed on an underlying layer such that portions of the underlying layer are uncovered;

executing a conformal film deposition process that conformally deposits a polymer film on the substrate, wherein the conformal film deposition process is executed for 1-9 seconds;

executing an activation etch process that etches the underlying layer for 3-9 seconds using the polymer film; and cycling steps of conformal film deposition and activation etch until removing a predetermined amount of the underlying layer, wherein executing the conformal film deposition includes maintaining plasma at a first plasma density, and wherein executing the activation etch process includes maintaining plasma at a second plasma density, wherein the first plasma density is greater than the second plasma density.

11. The method of claim 10, wherein relief pattern is a soft-mask material.

12. The method of claim 10, wherein executing the conformal film deposition process includes using an isotropic deposition process, and wherein executing the activation etch process includes using an anisotropic etch process.

13. The method of claim 10, wherein executing the activation etch process includes coupling low-frequency bias power to a plasma processing chamber.

14. A method of processing a substrate, the method comprising:

receiving a substrate having a working surface, the working surface having a relief pattern formed on an underlying layer such that portions of the underlying layer are uncovered;

executing a conformal film deposition process that conformally deposits a polymer film on the substrate, wherein the conformal film deposition process is executed for 1-9 seconds;

executing an activation etch process that etches the underlying layer for 3-9 seconds using the polymer film; and cycling steps of conformal film deposition and activation etch until removing a predetermined amount of the underlying layer, wherein executing the conformal film deposition includes using a $C_xF_y$ process gas, and wherein executing the activation etch process includes stopping flow of the $C_xF_y$ process gas.

15. A method of processing a substrate, the method comprising:

receiving a substrate having a working surface, the working surface having a relief pattern formed on an underlying layer such that portions of the underlying layer are uncovered;

executing a conformal film deposition process that conformally deposits a polymer film on the substrate, wherein the polymer film has a thickness of less than three nanometers;

executing an activation etch process that etches the underlying layer using the polymer film until the polymer film is removed from horizontal surfaces of the underlying layer that are parallel to the working surface, wherein the polymer film is activated by an ion energy to react with material of the underlying layer to remove a portion of the underlying layer; and cycling steps of conformal film deposition and activation etch until removing a predetermined amount of the underlying layer that is uncovered by the relief pattern.

16. The method of claim 15, wherein executing the conformal film deposition includes maintaining plasma at a first ion energy below a threshold energy sufficient for activating etching based on a particular combination of deposited polymer film and ion, and wherein executing the activation etch process includes maintaining plasma at a second ion energy, wherein the second ion energy is greater than the first ion energy.

17. The method of claim 15, wherein executing the conformal film deposition includes using a $C_xF_y$ process gas, and wherein executing the activation etch process includes stopping flow of the $C_xF_y$ process gas.

* * * * *